(12) United States Patent
Dinu-Gürtler et al.

(10) Patent No.: US 8,586,949 B2
(45) Date of Patent: Nov. 19, 2013

(54) CHARGED PARTICLE LITHOGRAPHY SYSTEM WITH INTERMEDIATE CHAMBER

(75) Inventors: Laura Dinu-Gürtler, Delft (NL); Willem Henk Urbanus, Culemborg (NL); Marco Jan-Jaco Wieland, Delft (NL); Stijn Willem Herman Karel Steenbrink, The Hague (NL)

(73) Assignee: Mapper Lithography IP B.V., Delft (NL)

( * ) Notice: Subject to any disclaimer, the term of this patent is extended or adjusted under 35 U.S.C. 154(b) by 184 days.

(21) Appl. No.: 13/295,249

(22) Filed: Nov. 14, 2011

(65) Prior Publication Data

US 2012/0293780 A1 Nov. 22, 2012

Related U.S. Application Data

(60) Provisional application No. 61/413,396, filed on Nov. 13, 2010, provisional application No. 61/415,232, filed on Nov. 18, 2010, provisional application No. 61/421,717, filed on Dec. 10, 2010, provisional application No. 61/443,466, filed on Feb. 16, 2011, provisional application No. 61/477,688, filed on Apr. 21, 2011.

(51) Int. Cl.
*H01J 37/147* (2006.01)
*H01J 37/10* (2006.01)
*G03B 27/26* (2006.01)
*G21K 5/04* (2006.01)

(52) U.S. Cl.
USPC ............... 250/492.22; 250/492.1; 250/492.2; 250/492.3; 250/443.1; 250/396 R; 250/398

(58) Field of Classification Search
USPC ........ 250/492.22, 492.2, 492.1, 492.3, 443.1, 250/396 R, 398
See application file for complete search history.

(56) References Cited

U.S. PATENT DOCUMENTS

| 4,916,322 | A | 4/1990 | Glavish et al. |
|---|---|---|---|
| 6,897,458 | B2 | 5/2005 | Wieland et al. |
| 6,958,804 | B2 | 10/2005 | Wieland et al. |
| 7,084,414 | B2 | 8/2006 | Wieland et al. |
| 7,129,502 | B2 | 10/2006 | Kruit |
| 7,781,748 | B2 * | 8/2010 | Platzgummer ........... 250/492.22 |

(Continued)

FOREIGN PATENT DOCUMENTS

| EP | 1983548 A1 | 10/2008 |
|---|---|---|
| WO | 2010094719 A1 | 8/2010 |

*Primary Examiner* — Nikita Wells
(74) *Attorney, Agent, or Firm* — Hoyng Monegier LLP; David P. Owen; Coraline J. Haitjema

(57) ABSTRACT

A charged particle lithography system for transferring a pattern onto the surface of a target, comprising a main vacuum chamber, a source chamber and an intermediate chamber, both located in the main vacuum chamber, a beam generator for generating a charged particle beam, the beam generator located in the source chamber, and a first aperture array element for generating a plurality of charged particle beamlets from the beam, the first aperture array element located in the intermediate chamber. The system is adapted for maintaining a first pressure in the main vacuum chamber, a second pressure in the intermediate chamber, and a third pressure in the source chamber, and wherein the first pressure is lower than an ambient pressure, the second pressure is lower than the first pressure, and the third pressure is lower than the second pressure.

16 Claims, 10 Drawing Sheets

(56) References Cited

U.S. PATENT DOCUMENTS

2006/0011834 A1 1/2006 Nishimura et al.
2010/0270299 A1 10/2010 Baltussen et al.
2012/0145915 A1* 6/2012 Van Veen et al. .......... 250/396 R
2012/0292491 A1* 11/2012 Wieland et al. ............... 250/215
2012/0292524 A1* 11/2012 Wieland et al. ............... 250/398

* cited by examiner

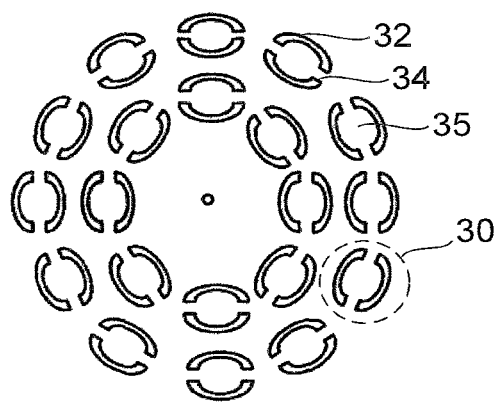 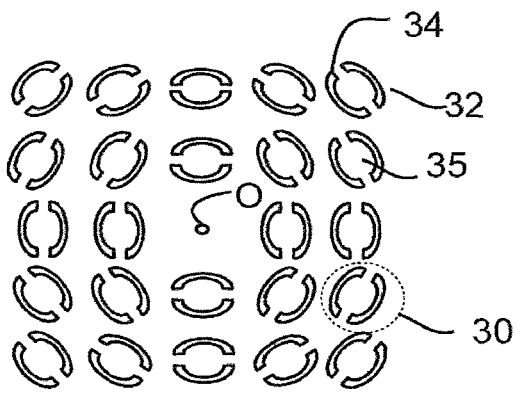
*Fig. 3a*   *Fig. 3b*
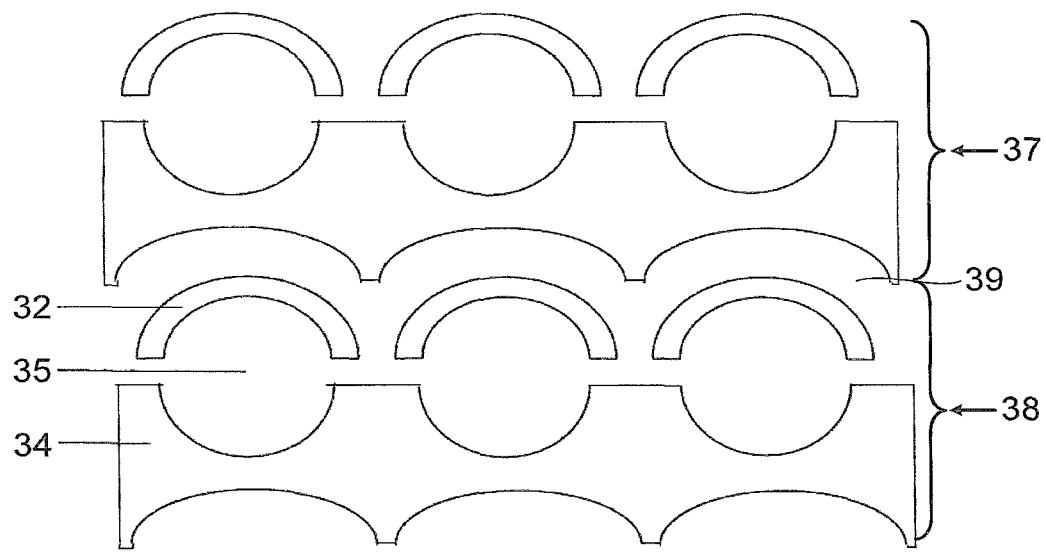
*Fig. 4*

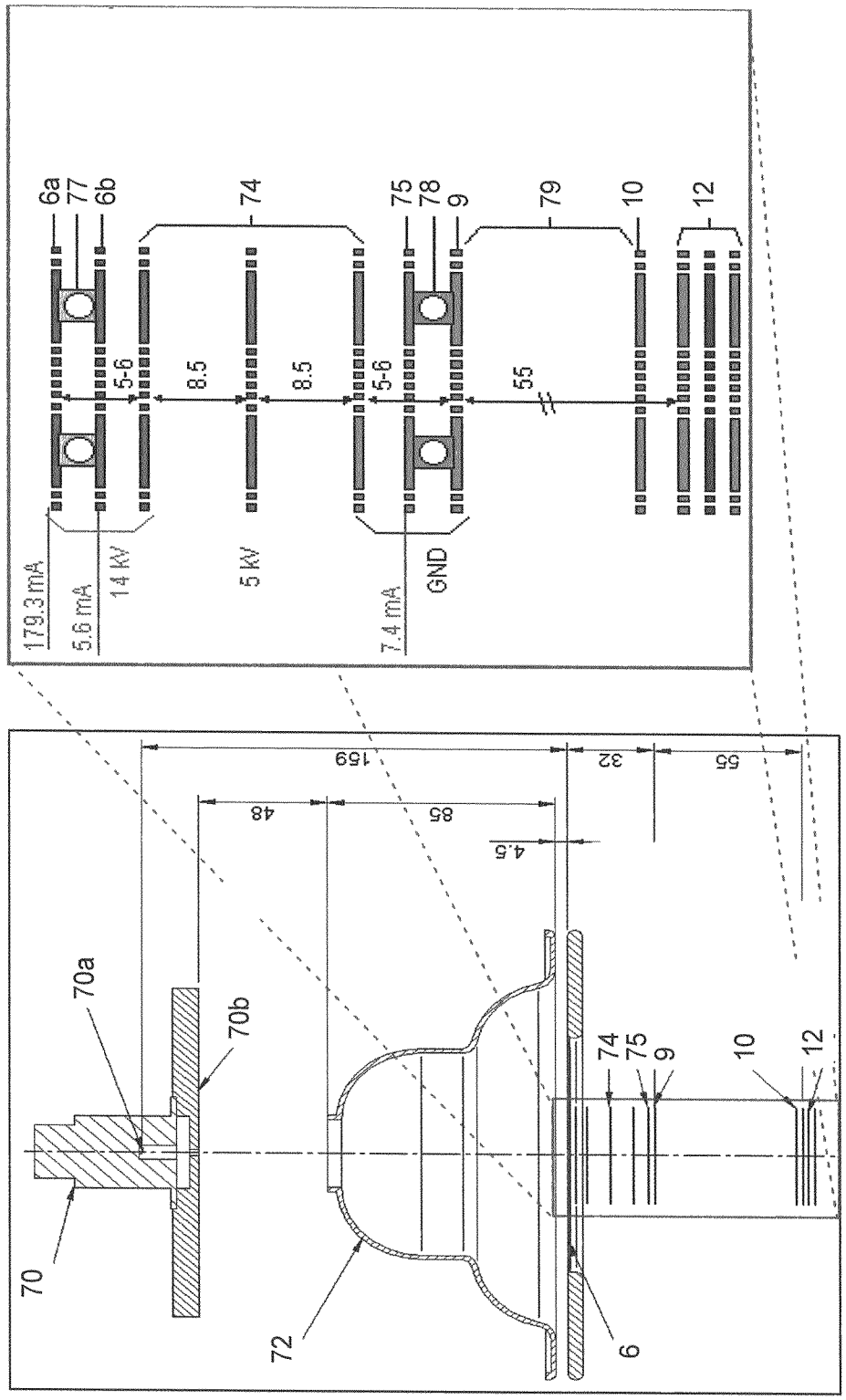

CHARGED PARTICLE LITHOGRAPHY SYSTEM WITH INTERMEDIATE CHAMBER

BACKGROUND OF THE INVENTION

1. Field of the Invention

The present invention relates to a charged particle lithography apparatus, and in particular to an aperture array for a lithography system with a cooling system.

2. Description of the Related Art

Currently, most commercial lithography systems use a light beam and mask as a means to reproduce pattern data for exposing a target, such as a wafer with a coating of resist. In a maskless lithography system, beams of charged particles are used to write the pattern data onto the target. The beamlets are individually controlled, for example by individually switching them on and off, to generate the required pattern. For high resolution lithography systems designed to operate at a commercially acceptable throughput, the size, complexity, and cost of such systems becomes an obstacle.

Furthermore, existing charged particle beam technology is suitable for lithography systems for relatively course patterning of images, for example to achieve critical dimensions of 90 nm and higher. However, a growing need exists for improved performance. It is desired to achieve considerably smaller critical dimensions, for example 22 nm, while maintaining sufficient wafer throughput, e.g. between 10 and 100 wafers per hour. In order to achieve such a large throughput at ever decreasing feature sizes it is necessary to increase the number of beams generated by the system, increase the current in the charged particle beams, and reduce the distance between the beams.

Charged particle beam lithography systems are typically operated in a vacuum environment provided by a vacuum chamber. The source which generates the charged particle beam preferably operates in a high vacuum environment, and attaining this high vacuum in the vacuum chamber is difficult and time consuming, reducing overall throughput of the lithography system. Furthermore, contaminants such as water vapour and hydrocarbons outgassed from the resist-covered wafer and components of the system in the vacuum chamber are also a problem.

BRIEF SUMMARY OF THE INVENTION

The present invention seeks to address these problems by providing a charged particle lithography system for transferring a pattern onto the surface of a target. The system comprises a main vacuum chamber, a source chamber and an intermediate chamber, both located in the main vacuum chamber, a beam generator for generating a charged particle beam, the beam generator located in the source chamber, and a first aperture array element for generating a plurality of charged particle beamlets from the beam, the first aperture array element located in the intermediate chamber. The system is adapted for maintaining a first pressure in the main vacuum chamber, a second pressure in the intermediate chamber, and a third pressure in the source chamber, and wherein the first pressure is lower than an ambient pressure, the second pressure is lower than the first pressure, and the third pressure is lower than the second pressure.

The intermediate chamber may include a first opening for permitting transmission of the charged particle beam from the source chamber into the intermediate chamber, and a second opening for permitting transmission of the charged particle beamlets out of the intermediate chamber into the main vacuum chamber, wherein apertures of the first aperture array element form the second opening.

The system may further comprise a valve for closing the second opening of the intermediate chamber. The source chamber may comprise an outlet and pumping system for producing the third pressure in the source chamber, and the pump may comprise a chemical or getter pump. The source chamber and the intermediate chamber may each comprise an outlet and pumping system for producing the second pressure in the intermediate chamber and the third pressure in the source chamber, and the pumps may comprise chemical or getter pumps.

The system may further comprise a collimating system located in the intermediate chamber adapted for collimating the charged particle beam prior before it reaches the first aperture array. The first aperture array element may comprises a plurality of apertures arranged in a plurality of groups, the apertures for letting the beamlets pass through the aperture array element, wherein the groups of apertures form beam areas distinct and separate from a plurality of non-beam areas formed between the beam areas and containing no apertures for passage of the beamlets.

The first aperture array element may be provided with cooling channels adapted for transmission of a cooling medium for cooling the first aperture array element, the cooling channels being provided in the non-beam areas of the first aperture array element.

The first aperture array element may comprise a plate having a thickness and a width, wherein the apertures are formed through the thickness of the plate in the non-beam areas of the plate, and the cooling channels are formed internally in the non-beam areas of the plate and extend in a direction of the width of the plate. The first aperture array element may comprise an integral current limiting aperture array, the apertures of the first aperture array element having a narrowest portion recessed below an upper surface of the first aperture array element facing towards the beam generator.

The system may further comprises a plurality of aperture array elements including the first aperture array element, a blanker array, a beam stop array, and a projection lens array, each comprising a plurality of apertures arranged in a plurality of groups, the apertures for letting the beamlets pass through the aperture array elements, and wherein the groups of apertures of each aperture array element form beam areas distinct and separate from a plurality of non-beam areas formed between the beam areas and containing no apertures for passage of the beamlets, and wherein the beam areas of the aperture array elements are aligned to form beam shafts, each comprising a plurality of beamlets, and the non-beam areas of the aperture array elements are aligned to form non-beam shafts not having beamlets present therein.

The first aperture array element may be provided with a curved upper surface facing towards the beam generator. The first aperture array element may be subdivided into alternating aperture-free areas and aperture areas, each aperture area comprising a plurality of apertures, and wherein the curved upper surface encompasses a plurality of the aperture-free areas and aperture areas. The curved upper surface of the first aperture array element may form a raised dome-shaped area protruding above the upper surface towards the beam generator, or it may form a dome-shaped depression in the upper surface area facing the beam generator. The system may have an optical axis and the curved surface shaped according to a cosine function centred around the optical axis.

BRIEF DESCRIPTION OF THE DRAWINGS

Various aspects of the invention and certain examples of embodiments of the invention are illustrated in the drawings in which:

FIGS. 3A and 3B are schematic diagrams of arrangements of electrodes within a beamlet blanker array;

FIG. 4 is a schematic diagram of another embodiment of electrodes within a beamlet blanker array;

FIGS. 7A and 7B are schematic diagrams of a lithography machine with a column divided into beam and non-beam areas;

DESCRIPTION OF ILLUSTRATIVE EMBODIMENTS

The following is a description of various embodiments of the invention, given by way of example only and with reference to the figures. The figures are not drawn to scale and merely intended for illustrative purposes.

Figure 1:
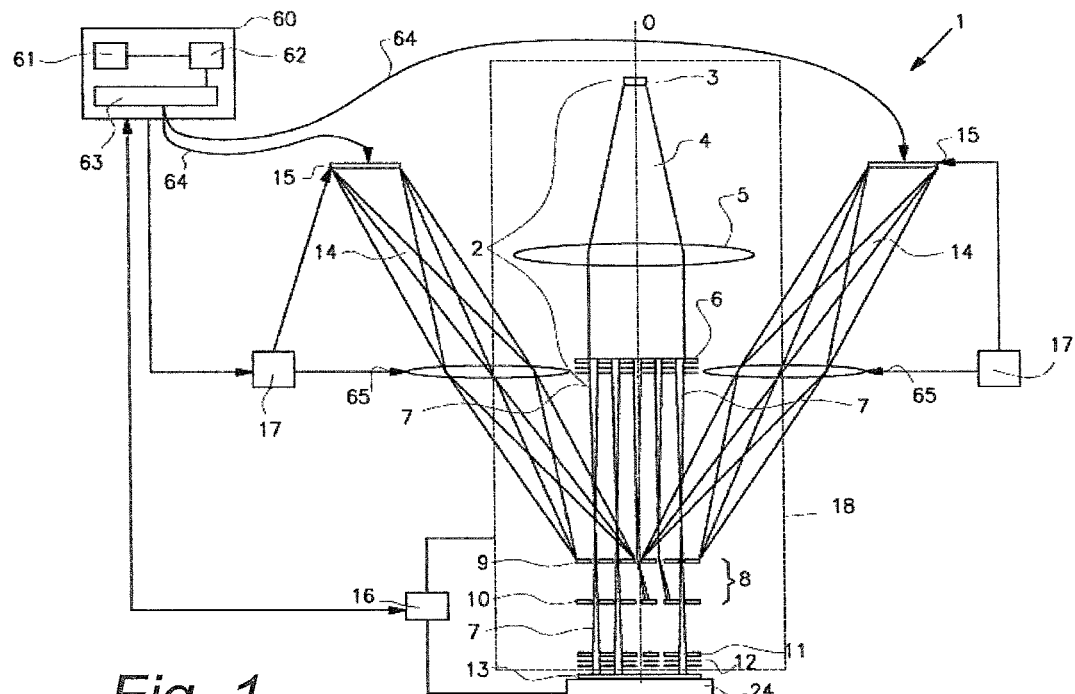
FIG. 1 is a simplified schematic diagram of an embodiment of a charged particle multi-beamlet lithography system.

FIG. 1 shows a simplified schematic drawing of an embodiment of a charged particle multi-beamlet lithography system 1. Such lithography system is for example described in U.S. Pat. Nos. 6,897,458 and 6,958,804 and 7,084,414 and 7,129,502, which are assigned to the applicant of the present application and which are hereby incorporated by reference in their entirety.

Such lithography system 1 suitably comprises a beamlet generator generating a plurality of beamlets, a beamlet modulator patterning the beamlets to form modulated beamlets, and a beamlet projector for projecting the modulated beamlets onto a surface of a target. The beamlet generator typically comprises a source and at least one beam splitter. The source in FIG. 1 is an electron source 3 arranged to produce a substantially homogeneous, expanding electron beam 4. The beam energy of the electron beam 4 is preferably maintained relatively low in the range of about 1 to 10 keV. To achieve this, the acceleration voltage is preferably low, and the electron source 3 may be kept at a voltage between about −1 to −10 kV with respect to the target at ground potential, although other settings may also be used.

In FIG. 1, the electron beam 4 from the electron source 3 passes a collimator lens 5 for collimating the electron beam 4. The collimator lens 5 may be any type of collimating optical system. Before collimation, the electron beam 4 may pass a double octopole (not shown). Subsequently, the electron beam 4 impinges on a beam splitter, in the embodiment of FIG. 1, a first aperture array 6 (although it is possible there are other aperture arrays before array 6). The first aperture array 6 preferably comprises a plate having through-holes. The aperture array 6 is arranged to block part of the beam 4. Additionally, the array 6 allows a plurality of beamlets 7 to pass through so as to produce a plurality of parallel electron beamlets 7.

The lithography system 1 of FIG. 1 generates a large number of beamlets 7, preferably about 10,000 to 1,000,000 beamlets, although it is of course possible that more or less beamlets are generated. Note that other known methods may also be used to generate collimated beamlets. A second aperture array may be added in the system, so as to create subbeams from the electron beam 4 and to create electron beamlets 7 from the subbeam. This allows for manipulation of the subbeams further downstream, which turns out beneficial for the system operation, particularly when the number of beamlets in the system is 5,000 or more.

The beamlet modulator, denoted in FIG. 1 as modulation system 8, typically comprises a beamlet blanker array 9 comprising an arrangement of a plurality of blankers, and a beamlet stop array 10. The blankers are capable of deflecting one or more of the electron beamlets 7. In embodiments of the invention, the blankers are more specifically electrostatic deflectors provided with a first electrode, a second electrode and an aperture. The electrodes are then located on opposing sides of the aperture for generating an electric field across the aperture. Generally, the second electrode is a ground electrode, i.e. an electrode connected to ground potential.

To focus the electron beamlets 7 within the plane of the blanker array 9 the lithography system may further comprise a condenser lens array (not shown).

In the embodiment of FIG. 1, the beamlet stop array 10 comprises an array of apertures for allowing beamlets to pass through. The beamlet stop array 10, in its basic form, comprises a substrate provided with through-holes, typically round holes although other shapes may also be used. In some embodiments, the substrate of the beamlet stop array 10 is formed from a silicon wafer with a regularly spaced array of through-holes, and may be coated with a surface layer of a metal to prevent surface charging. In some further embodiments, the metal is of a type that does not form a native-oxide skin, such as CrMo.

The beamlet blanker array 9 and the beamlet stop array 10 operate together to block or let pass the beamlets 7. In some embodiments, the apertures of the beamlet stop array 10 are aligned with the apertures of the electrostatic deflectors in the beamlet blanker array 9. If beamlet blanker array 9 deflects a beamlet, it will not pass through the corresponding aperture in the beamlet stop array 10. Instead the beamlet will be blocked by the substrate of beamlet block array 10. If beamlet blanker array 9 does not deflect a beamlet, the beamlet will pass through the corresponding aperture in the beamlet stop array 10. In some alternative embodiments, cooperation between the beamlet blanker array 9 and the beamlet stop array 10 is such that deflection of a beamlet by a deflector in the blanker array 9 results in passage of the beamlet through the corresponding aperture in the beamlet stop array 10, while non-deflection results in blockage by the substrate of the beamlet stop array 10.

The modulation system 8 is arranged to add a pattern to the beamlets 7 on the basis of input provided by a control unit 60. The control unit 60 may comprise a data storage unit 61, a read out unit 62 and data converter 63. The control unit 60 may be located remote from the rest of the system, for instance outside the inner part of a clean room. Using optical fibers 64, modulated light beams 14 holding pattern data may be transmitted to a projector 65 which projects light from the ends of fibers within a fiber array (schematically depicted as plate 15) into the electron optical portion of the lithography system 1, schematically denoted by the dashed box and reference number 18.

In the embodiment of FIG. 1, the modulated light beams are projected on to the beamlet blanker array 9. More particularly, the modulated light beams 14 from optical fiber ends are projected on corresponding light sensitive elements located on the beamlet blanker array 9. The light sensitive elements may be arranged to convert the light signal into a different type of signal, for example an electric signal. A modulated light beam 14 carries a portion of the pattern data for controlling one or more blankers that are coupled to a corresponding light sensitive element. Suitably, in order to project the light beams 14 onto corresponding light sensitive elements optical elements such as a projector 65 may be used. Additionally, to allow projection of the light beams 14 at a suitable incident angle, a mirror may be included, for example suitably placed between a projector 65 and the beamlet blanker array 9.

The projector 65 may be appropriately aligned with the plate 15 by a projector positioning device 17 under control of the control unit 60. As a result, the distance between the projector 65 and the light sensitive elements within the beamlet blanker array 9 may vary as well.

In some embodiments, the light beams may, at least partially, be transferred from the plate towards the light sensitive elements by means of an optical waveguide. The optical waveguide may guide the light to a position very close to the light sensitive elements, suitably less than a centimeter, preferably in the order of a millimeter away. A short distance between an optical waveguide and a corresponding light sensitive elements reduces light loss. On the other hand, the use of plate 15 and a projector 65 located away from the space that may be occupied by the charged particle beamlets has the advantage that the beamlet disturbance is minimized, and the construction of the beamlet blanker array 9 is less complex.

The modulated beamlets coming out of the beamlet modulator are projected as a spot onto a target surface 13 of a target 24 by the beamlet projector. The beamlet projector typically comprises a scanning deflector for scanning the modulated beamlets over the target surface 13 and a projection lens system for focusing the modulated beamlets onto the target surface 13. These components may be present within a single end module.

Such end module is preferably constructed as an insertable, replaceable unit. The end module may thus comprise a deflector array 11, and a projection lens arrangement 12. The insertable, replaceable unit may also include the beamlet stop array 10 as discussed above with reference to the beamlet modulator. After leaving the end module, the beamlets 7 impinge on a target surface 13 positioned at a target plane. For lithography applications, the target usually comprises a wafer provided with a charged-particle sensitive layer or resist layer.

The deflector array 11 may take the form of a scanning deflector array arranged to deflect each beamlet 7 that passed the beamlet stop array 10. The deflector array 11 may comprise a plurality of electrostatic deflectors enabling the application of relatively small driving voltages. Although the deflector array 11 is drawn upstream of the projection lens arrangement 12, the deflector array 11 may also be positioned between the projection lens arrangement 12 and the target surface 13.

The projection lens arrangement 12 is arranged to focus the beamlets 7, before or after deflection by the deflector array 11. Preferably, the focusing results a geometric spot size of about 10 to 30 nanometers in diameter. In such preferred embodiment, the projection lens arrangement 12 is preferably arranged to provide a demagnification of about 100 to 500 times, most preferably as large as possible, e.g. in the range 300 to 500 times. In this preferred embodiment, the projection lens arrangement 12 may be advantageously located close to the target surface 13.

In some embodiments, a beam projector may be located between the target surface 13 and the projection lens arrangement 12. The beam protector may be a foil or a plate provided with a plurality of suitably positioned apertures. The beam protector is arranged to absorb the released resist particles before they can reach any of the sensitive elements in the lithography system 1.

The projection lens arrangement 12 may thus ensure that the spot size of a single pixel on the target surface 13 is correct, while the deflector array 11 may ensure by appropriate scanning operations that the position of a pixel on the target surface 13 is correct on a microscale. Particularly, the operation of the deflector array 11 is such that a pixel fits into a grid of pixels which ultimately constitutes the pattern on the target surface 13. It will be understood that the macroscale positioning of the pixel on the target surface 13 is suitably enabled by a wafer positioning system present below the target 24.

Commonly, the target surface 13 comprises a resist film on top of a substrate. Portions of the resist film will be chemically modified by application of the beamlets of charged particles, i.e. electrons. As a result thereof, the irradiated portion of the film will be more or less soluble in a developer, resulting in a resist pattern on a wafer. The resist pattern on the wafer can subsequently be transferred to an underlying layer, i.e. by implementation, etching and/or deposition steps as known in the art of semiconductor manufacturing. Evidently, if the irradiation is not uniform, the resist may not be developed in a uniform manner, leading to mistakes in the pattern. High-quality projection is therefore relevant to obtain a lithography system that provides a reproducible result. No difference in irradiation ought to result from deflection steps.

Figure 2:
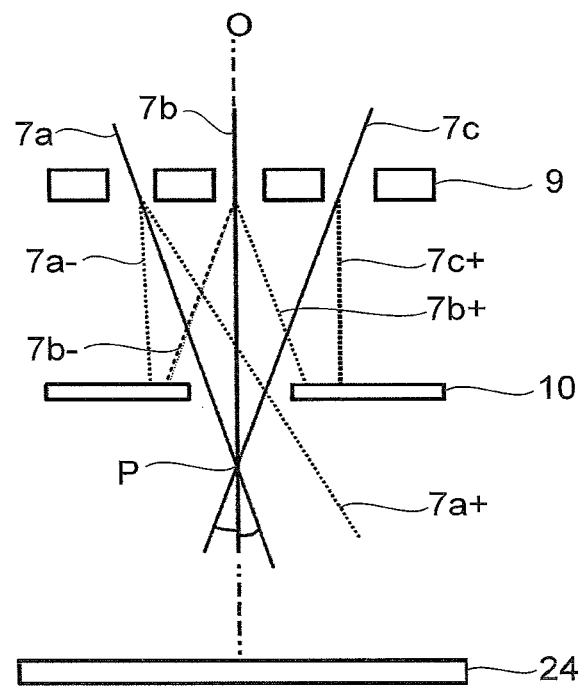
FIG. 2 is a schematic diagram showing operation of an embodiment of the beamlet blanker array in the lithography system of FIG. 1.

FIG. 2 schematically shows the operation of an embodiment of the beamlet blanker array 9 in the lithography system of FIG. 1. In particular, FIG. 2 schematically shows a cross-sectional view of a portion of a beamlet modulator comprising a beamlet blanker array 9 and beamlet stop array 10. The beamlet blanker array 9 is provided with a plurality of apertures 35. For sake of reference the target 24 has also been indicated. The figure is not drawn to scale.

The shown portion of the beamlet modulator is arranged to modulate three beamlets 7a, 7b, and 7c. The beamlets 7a, 7b, 7c may form part of a single group of beamlets that may be generated from a beam originating from a single source or from a single subbeam. The beamlet modulator of FIG. 2 is arranged for converging groups of beamlets towards a common point of convergence P for each group. This common point of convergence P is preferably located on an optical axis O for the group of beamlets.

FIG. 3A schematically shows a top view of an arrangement of electrodes within a beamlet blanker array wherein the beamlet blanker array is arranged to converge groups of beamlets towards a common point of convergence. In this embodiment the beamlet blankers take the form of electrostatic modulators 30, each modulator 30 comprising a first electrode 32, a second electrode 34, and an aperture 35 extending through the body of the beamlet blanker array. The electrodes 32, 34 are located on opposing sides of the aperture 35 for generating an electric field across the aperture 35. The individual modulators 30 form a radial arrangement around a centrally located optical axis O. In the embodiment shown in FIG. 3A, both electrodes 32, 34 have a concave shape, which makes the shape of the electrodes 32, 34 conform to the cylindrical apertures 35. This cylindrical aperture shape is in itself suitable for preventing the introduction of certain optical aberrations, such as astigmatism.

FIG. 3B shows an alternative arrangement of electrodes within a beamlet blanker array wherein the beamlet blanker array is arranged to converge groups of beamlets towards a common point of convergence. In this arrangement the individual modulators 30 do again form a radial arrangement around a centrally located optical axis O. However, the individual modulators 30 are not placed in concentric circles around the optical axis, but in an array formed by columns and rows with orientations substantially perpendicular to each other. Simultaneously, the electrodes 32, 34 of the individual modulators 30 do have an orientation such that they can deflect beamlets along radial lines extending from the optical axis O.

FIG. 4 schematically shows a top view of yet another embodiment of electrodes within a beamlet blanker array. In this embodiment, the electrodes 32, 34 are again situated around apertures 35, but the second electrodes 34 of several modulators 30 are integrated into a single strip. The modulators 30 are arranged in rows. An isolation zone 39 is suitably present between a first row 37 of modulators 30 and a second row 38 of modulators 30. The isolation zone 39 is designed to prevent undesired discharge.

Figure 5:
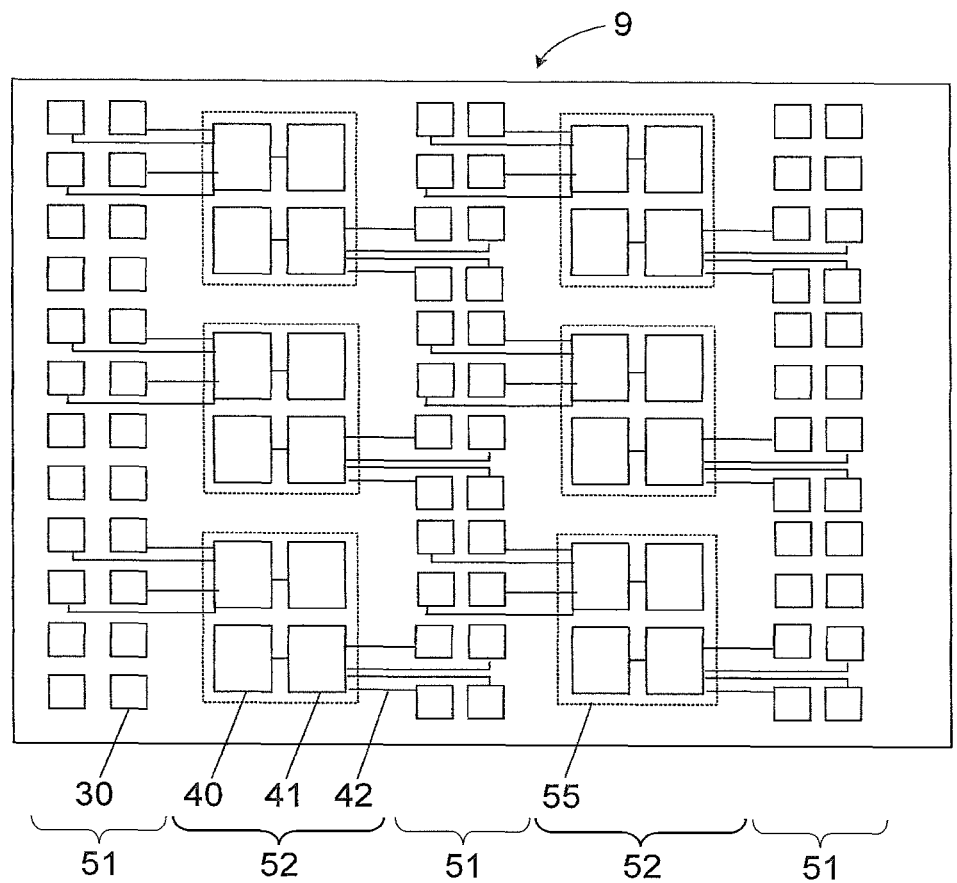
FIG. 5 is a schematic diagram of a topographic arrangement of components for a beamlet blanker array.

FIG. 5 schematically shows a top view of a topographic arrangement of components that may be used in a beamlet blanker array 9 according to embodiments of the invention. The beamlet blanker array is divided into beam areas 51 and non-beam areas 52. The beam areas 51 represent areas arranged to receive and modulate beamlets. The non-beam areas 52 are areas arranged to provide an area for components needed to support the components within the beam areas 51.

Components being present within the beam areas 51 include the modulators 30. The modulators 30 may take the form of electrostatic deflectors as discussed with reference to FIGS. 2-4.

Components within the non-beam areas 52 may include light sensitive elements 40 arranged to receive modulated light signals, for example in a way as discussed with reference to FIG. 1. Suitable examples of light sensitive elements 40 include but are not limited to photodiodes and phototransistors. The non-beam areas in the embodiment shown in FIG. 5 further include demultiplexers 41. The light signals received by the light sensitive elements 40 may be multiplexed signals to include information for more than one modulator 30. Therefore, after reception of the light signal by the light sensitive element 40, the light signal is transferred to a demultiplexer 41 where the signal is demultiplexed. After demultiplexing, the demultiplexed signals are forwarded to the correct modulators 30 via dedicated electrical connections 42.

As a result of the use of multiplexed light signals and an arrangement of light sensitive elements 40 and demultiplexers 41, the number of light sensitive elements 40 is lower than the number of modulators 30. Having a limited number of light sensitive elements 40 enables reduction of the dimensions of the non-beam areas 52. The beam areas 51 may then be placed more closely together to increase the number of modulators 30 per unit area in the blanker array. In comparison to the non-multiplexed embodiment, the lay-out of the beamlet blanker array would then be more compact if the same number of modulators would be used. If the dimensions of the blanker array would remain substantially the same, more modulators could be used. Alternatively, instead of decreasing the size of the non-beam areas 52 the use of the multiplexed embodiment could enable the use of light sensitive elements 40 with a greater light receiving area. The use of a greater light receiving area per light sensitive element 40 reduces the complexity of the optics needed to direct the light signals towards the correct light sensitive element 40 and makes the light receiving structure more robust.

Figure 6:
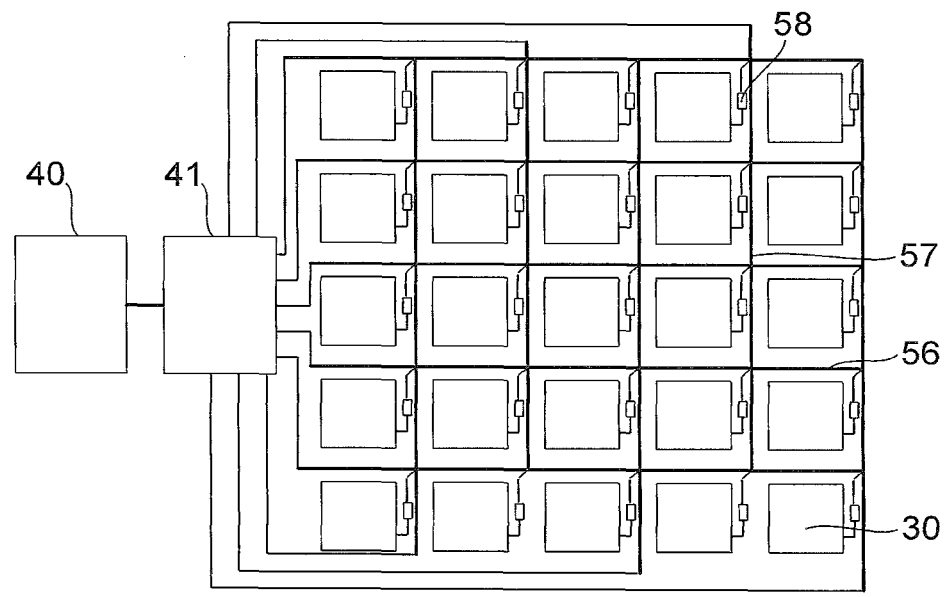
FIG. 6 is a schematic diagram of another topographic arrangement of components for a beamlet blanker array.

The modulators 30 may be suitably arranged in columns and rows to allow addressing via wordlines 56 and bitlines 57 and storage elements 58, as shown in FIG. 6. Such arraywise addressing reduces the number of connections extending from the demultiplexer 41 to the modulators 30. For example, in FIG. 6 only 10 connection lines are present, while individual addressing would result in 25 connection lines to address the 25 modulators 30. Such reduction of connection lines improves the reliability of the beamlet blanker array 9 as it becomes less susceptible to failure due to a malfunctioning connection between a demultiplexer 41 and a modulator 30. Furthermore, the connections may occupy less space if placed in such arraywise addressing arrangement.

FIGS. 7A and 7B are schematic diagrams of a lithography machine with the column divided into beam and non-beam areas, showing more detail of some of the elements of the machine. FIG. 7A shows a charged particle source comprising an electron gun 70 with cathode 70a and gun mounting plate 70b. A collimator electrode 72 and a series of array elements including aperture array 6, condenser lens arrays 74, multi-aperture array 75, beamlet blanker array 9, beam stop array 10, and projection lens arrays 12.

FIG. 7B is an expanded view showing a cross-section through these aperture array elements. In the embodiment shown the first aperture array 6 includes a collimator aperture array 6a and current limiting array 6b. The system also includes three condenser lens arrays 74, a multi-aperture array 75, beamlet blanker array 9, beam stop array 10, and three projection lens arrays 12. Each aperture array element includes beam areas which comprise a large number of apertures through which a corresponding group of beamlets pass on their path from source to target, and non-beam areas in which have no apertures for beamlets. The beam areas comprise distinct and separate areas for conveying and manipulating the beamlets, and the non-beam areas comprise distinct and separate areas dedicated to accommodating components and circuitry for support of the functions of the various aperture array elements.

In the embodiment illustrated in FIG. 7B, the beam areas are located in corresponding vertical locations on the various aperture array elements, so that a vertical column of beamlets pass through the apertures of a single corresponding beam area of each aperture array element along the beamlets' trajectories. In the embodiment shown, there are multiple columns of beamlets, each column comprising substantially parallel beamlets and the different columns of beamlets substantially parallel to each other, and each group of beamlets passing through a single beam area of each aperture array element. In other embodiments, the beamlets within a column may be non-parallel, e.g. converging or diverging, and/or the columns of beamlets may be non-parallel. The non-beam areas are similarly located in corresponding vertical locations on the various aperture array elements. The resulting structure creates vertical shafts within the substantial part of the vertical height of the projection column of the lithography machine, alternating shafts occupied by charged particle beamlets and shafts in which no beamlets are present. The aperture array elements and projection column are usually located in a vacuum chamber, as shown for example schematically in FIGS. 8A and 8B.

In the embodiment of FIG. 7B, the alternating beamlet shafts and non-beamlet shafts begin from the first aperture array element 6a in the projection column. The first aperture array element 6a initially creates the shafts, due to the arrangement of apertures therein. The first aperture array element 6a may be made part of a collimator electrode, or located in close proximity to the collimator electrode, as shown in FIG. 7A. The collimator aperture array element 6a may be integral with a current limiting aperture array 6b having apertures aligned with or part of the apertures of aperture array 6a. These two aperture array elements may be provided with a common set of cooling ducts 77, located in the non-beams areas of the aperture array elements, for passage of a cooling medium such as water as indicated in FIG. 7B. Each aperture array element or integral set of aperture array elements may have their own set of cooling ducts, and the cooling setpoint set at a different temperature level, e.g. being set by flow rate of the cooling medium.

In the projection column of FIGS. 7A and 7B, the column subsequently comprises a condenser lens array 74, comprising in this embodiment a set of three condenser lens electrodes. Downstream from the condenser lens electrodes 74 is a multi-aperture array element 75 and a beamlet modulator or blanker element 9. Further downstream of these elements, with sufficient intervening space 79 to accommodate a light optics system and sensor, a beam stop array 10 is included, and yet further downstream a projection lens assembly 12. Beamlet deflector arrays are omitted from FIGS. 7A and 7B but may be located above or below the beam stop array.

Figure 9:
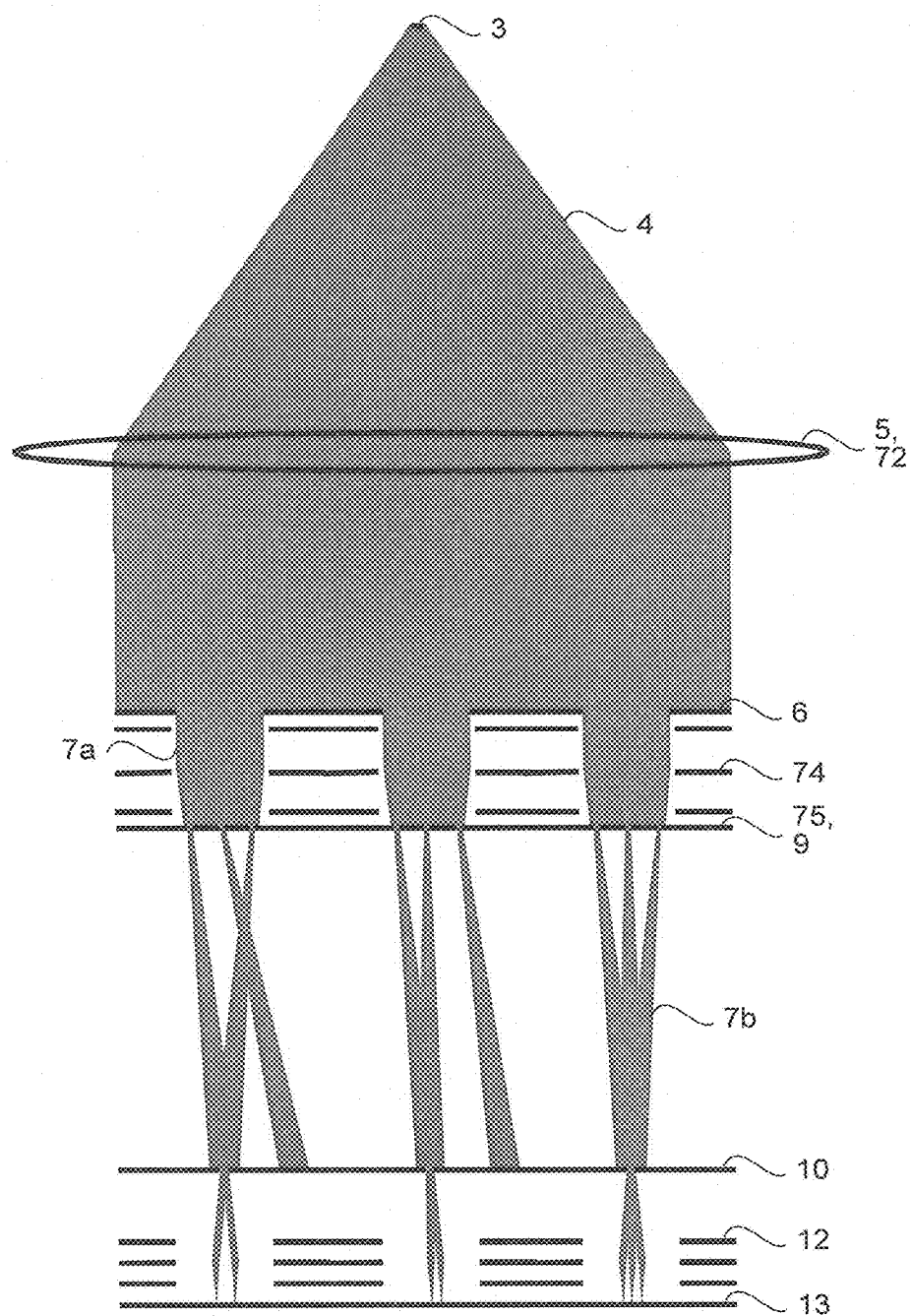
FIG. 9 is a simplified schematic diagram of a lithography machine forming multiple sub-beams and multiple beamlets.

The projection column and hence the system is now improved by having it partially sub-divided in beam and non-beam shafts. A simplified diagram of the projection column from source to target in shown in FIG. 9, showing a lithography machine forming multiple sub-beams 7a (by aperture array 6) and multiple beamlets 7b (by multi-aperture array 75) from each sub-beam, and the sub-beams and beamlets being arranged within the projection column in shafts alternating with non-beam shafts.

Such a division into beam and non-beam shafts at the location of the beamlet blanker element 9 allows for efficient spatial incorporation of light optics, light optics sensors and associated and further required electrical circuitry in the non-beam areas thereof. The light optics may comprise free space light optics, as well as optical fibers, guiding light signals from a pattern streaming system onto the beamlet blanker element, and in particular light sensitive elements located on the blanker element.

The beam and non-beam shafts may extend from the first aperture array element 6 up to the projection lens array element 12. This extent regards both the columns space as well as the elements included therein upstream and downstream. In all cases, especially at the aperture array elements 6a and 6b, multi-aperture array 75 and blanker array 9, and beam stop array 10, the non-beam areas are preferably provided with structural support elements, enhancing rigidity and hence the functional quality of the aperture array elements. As can be seen in FIG. 7B, the support elements may be common to two subsequent aperture array elements of the projection column. The structural element may also be adapted to function as a structural support element, e.g. in the form of a cooling duct for a cooling medium. In this respect, at least the first aperture array element 6 of the column, is provided with cooling ducts 77 in the non-beam areas.

Figures 8A, 8B:
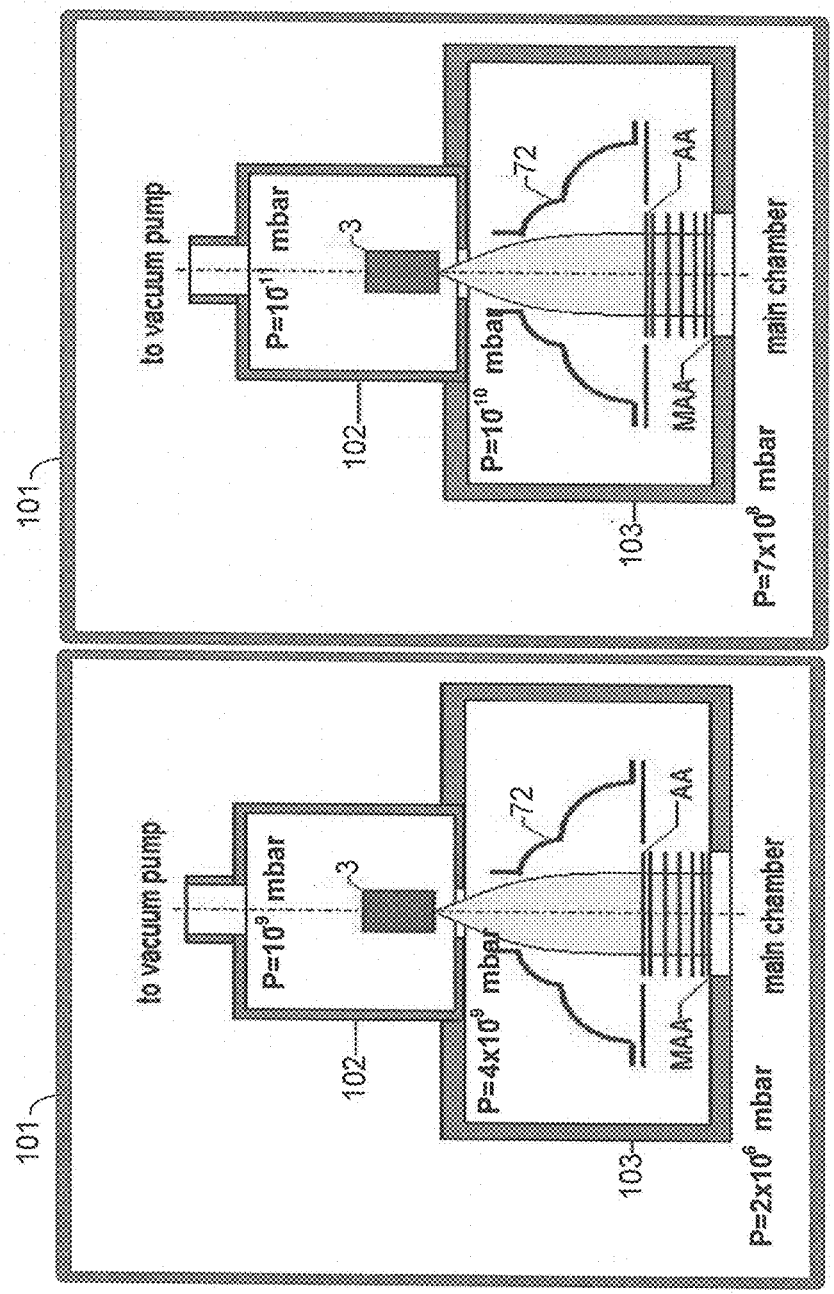
FIGS. 8A and 8B are schematic diagrams of a lithography machine showing aperture array elements in a vacuum chamber.

FIGS. 8A and 8B are simplified diagrams showing certain components of a projection column in a main vacuum chamber. FIG. 8A indicates a preferred operating vacuum pressure in the system with the main chamber at about $2 \times 10^{-6}$ mbar, the intermediate chamber at about $4 \times 10^{-9}$ mbar, and the source chamber at about $10^{-9}$ mbar. FIG. 8B shows a calculation of typical resulting partial pressure of hydrocarbon contaminants in the system, with hydrocarbon partial pressure in the main chamber of about $7 \times 10^{-8}$ mbar, in the intermediate chamber about $10^{-10}$ mbar, and in the source chamber about $10^{-11}$ mbar.

In this embodiment the source 3 is located in a separate source chamber 102, and in this embodiment the collimator 72 and aperture array elements from the first aperture array element (AA) to the multi-aperture array (MAA) are located in an intermediate chamber 103. An alternative embodiment also includes the beamlet blanker array element in the intermediate chamber 103, so that the much smaller apertures of the blanker array element form the opening between the intermediate chamber and the main chamber. In another embodiment the first aperture array element (AA) forms the opening between the intermediate chamber and the main chamber, with the remaining aperture array elements located in the main chamber.

Figure 10:
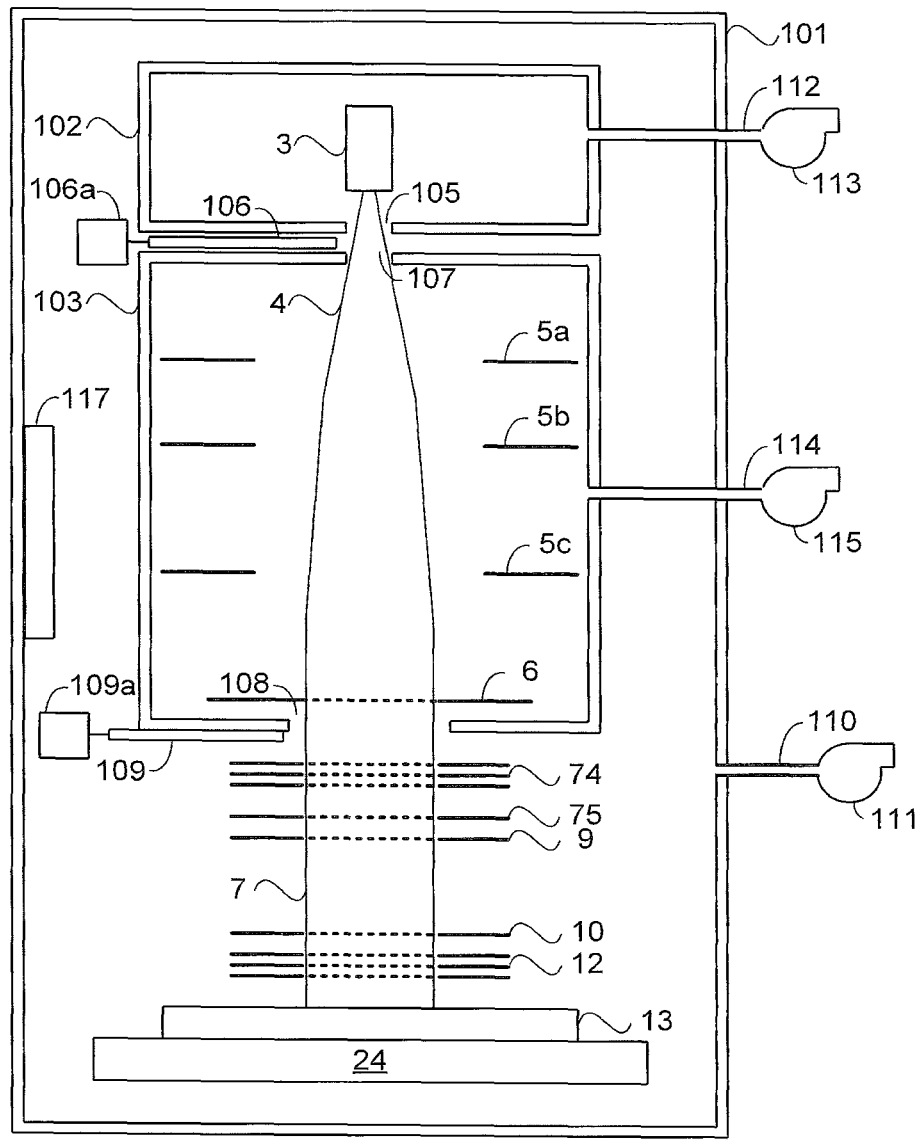
FIG. 10 is a schematic diagram illustrating a charged particle lithography system with an intermediate vacuum chamber.
Figure 11:
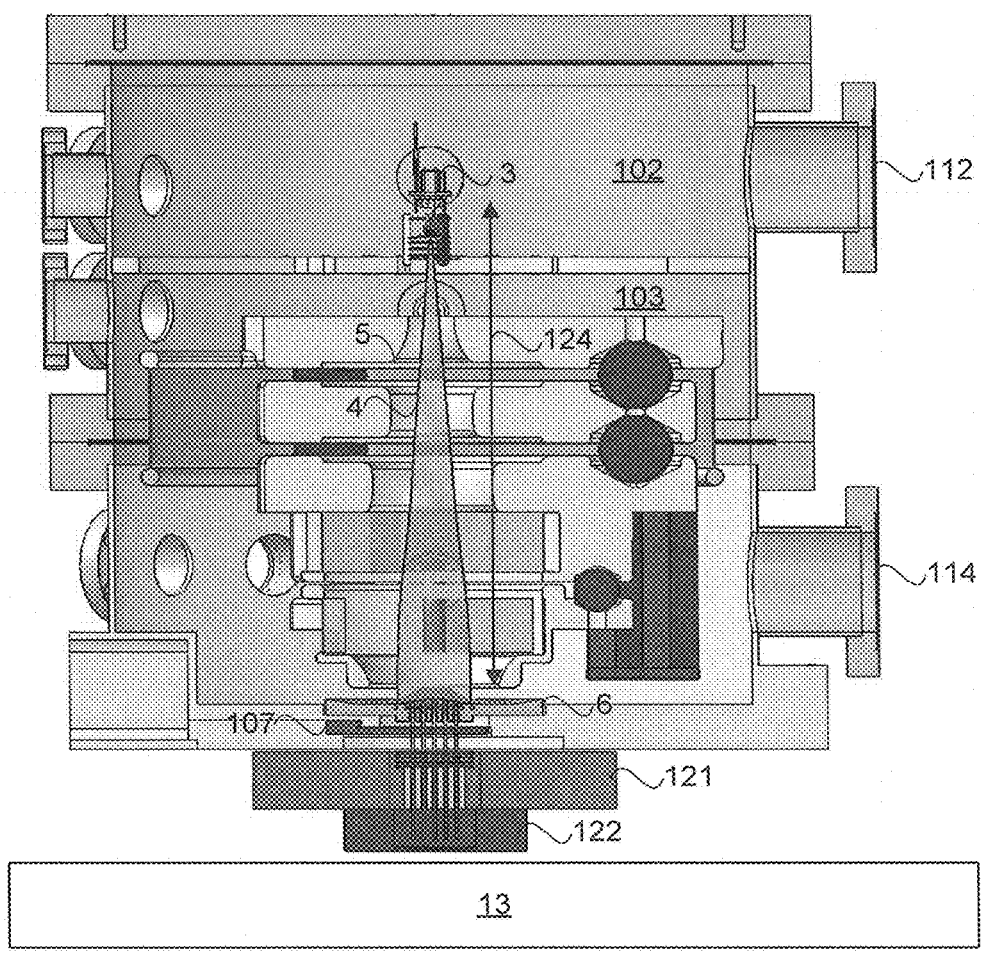
FIG. 11 is a cross section of an intermediate vacuum chamber and components of the charged particle lithography system of FIG. 10.
Figure 12:
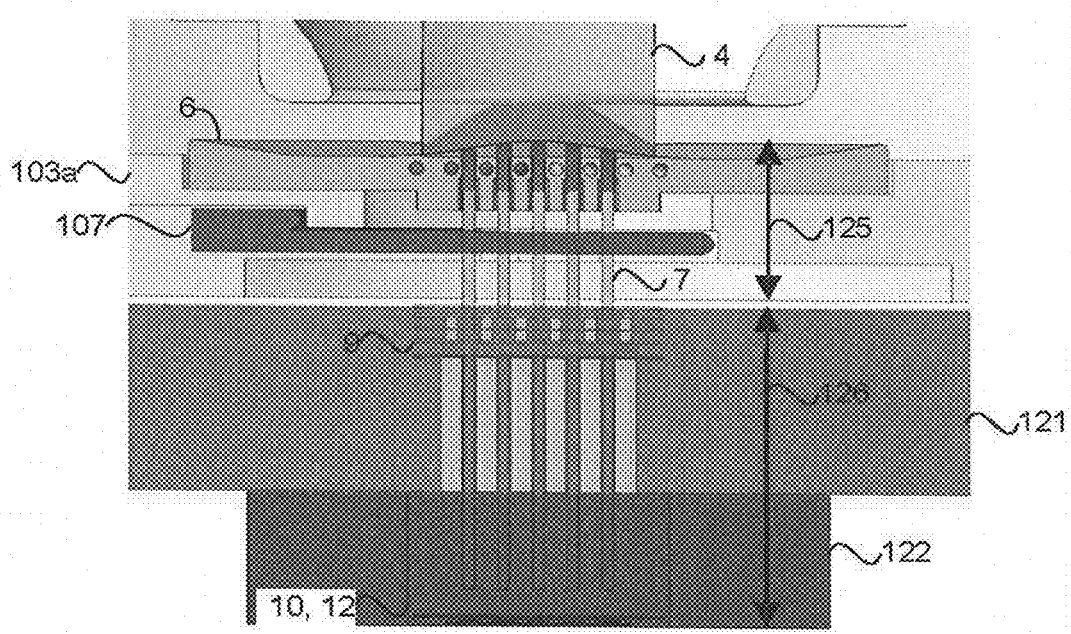
FIG. 12 is a detail view of components of the charged particle lithography system of FIG. 11.

FIG. 10 illustrates another embodiment of a charged particle lithography system with an intermediate vacuum chamber. FIG. 11 shows a cross section of an intermediate vacuum chamber and components of the lithography system of FIG. 10, and FIG. 12 shows more details of components of the lithography system of FIG. 11. The lithography system is enclosed in a main vacuum chamber 101. The lithography system operates in a vacuum environment. A vacuum is desired to remove particles which may be ionized by the charged particle beams and become attracted to the source, may dissociate and be deposited onto the lithography system's components, and may disperse the charged particle beams. A vacuum of about $2 \times 10^{-6}$ mbar is preferred. In order to maintain the vacuum environment, the charged particle lithography system is located in a main vacuum chamber 101. Note that FIG. 10 is a simplified diagram and many components of the lithography system are not shown that are normally located in the main vacuum chamber, e.g. the short stroke and long stroke wafer stages etc.

The charged particle source 3 is located in a source vacuum chamber 102 which is in turn located in the main vacuum chamber 101. This enables the environment in the source chamber 102 to be differentially pumped to a considerably higher vacuum than the main chamber 101, e.g. up to $10^{-10}$ mbar. Although only a single source 3 is shown in FIG. 10, the source chamber 102 may accommodate more than one source. The high vacuum within the source chamber 102 may promote the life time of the source 3, reduces the effects of gases in the source chamber interfering with the charged particle beam, and for some types of source may even be required for their functioning. The source is typically an electron source. A thermal dispenser type source may be used.

The high vacuum in the source chamber results in fewer free molecules circulating within the source chamber. Limiting free molecules in the source chamber limits contaminants from the main chamber such as water vapour and hydrocarbons outgassed from the resist-coated wafer being exposed can be limited, and reduces electron beam induced deposition (EBID) onto components in the source chamber.

The system of FIGS. 10-12 also includes an intermediate chamber 103 located in the main chamber 101. In this embodiment, the intermediate chamber houses the collimating system 5 (which may be e.g. a single collimator electrode 72 such as shown in FIG. 7A or one or more collimator lenses) and first aperture array element 6. Additional aperture array elements may be included in the intermediate chamber, such as in the embodiment shown in FIG. 8A.

The source and intermediate chambers may be constructed as a single vacuum chamber with a wall dividing the chamber into a top section for the source and bottom section comprising the intermediate chamber. Typical dimensions of the lithography column are 300 mm for distance 124 from the source 3 to the first aperture array 6, 30 mm for distance 125 from the first aperture array to the top of beam switching module 121, and 60 mm for distance 126 from the top of beam switching module 121 to the bottom of the projection optics module 122.

The environment in the intermediate chamber 103 is differentially pumped to an intermediate pressure, between the vacuum level of the main chamber and the source chamber. For example, the system may be operated with the main chamber at about $2 \times 10^{-6}$ mbar, the intermediate chamber at about $4 \times 10^{-9}$ mbar, and the source chamber at about $10^{-9}$ mbar. Similarly to the source chamber, this high vacuum results in fewer free molecules circulating within the intermediate chamber, limiting contaminants from the main chamber such as water vapour and outgassed hydrocarbons, and reducing EBID on the components in the intermediate chamber.

The source chamber 102 is provided with an opening 105 in the wall of the source chamber 102 to permit transmission of the charged particle beam 4 into the intermediate chamber 103 and main chamber 101. The source chamber may be provided with a valve 106 for closing the opening 105 if needed, that is if the pressure level within the source chamber needs to be maintained at a much lower pressure level than the pressure level in the vacuum chamber. For example, the valve 106 may be closed if the vacuum chamber is opened, for example for servicing purposes. In such a case a high vacuum level is maintained within the source chamber, which may improve downtime of the lithography apparatus. Instead of waiting until the pressure level within the source chamber is sufficient, now only the vacuum chamber needs to be pumped down to a desired pressure level, which level is higher than the level needed in the source chamber. The valve 106 is controlled by an actuation unit 106a that may comprise a piezo-electric actuator, for example Physikinstrumente model N-214 or N-215 NEXLINE®.

The opening 105 in the source chamber 102 to permit transmission of the charged particle beam 4 needs to be relatively large to emit a large beam. The size of this opening amounts to a substantial fraction of the round beam needed for a 26 mm×26 mm lithography system column, and this large opening is too large to maintain the large pressure drop from the main chamber 101 to the source chamber 102, i.e. a pressure differential from $10^{-9}$ mbar in the source chamber to $2 \times 10^{-6}$ mbar in the main chamber. The intermediate vacuum chamber 103 creates an intermediate pressure environment which enables this large pressure differential to be maintained.

The intermediate chamber has an opening 107 corresponding to the source chamber opening 105, for admitting the charged particle beam, and an opening 108 between the intermediate chamber and the main chamber permitting transmission of the charged particle beamlets into the main chamber. A valve 109 may be provided for closing the opening 109 if needed, e.g. if the main vacuum chamber is opened for servicing purposes. A high vacuum level can be maintained within the intermediate (and source) chamber, which may improve downtime of the lithography apparatus by reducing pump down time because only the main vacuum chamber needs to be pumped down to the desired pressure level, which is higher than the level needed in the intermediate and source chambers. The valve 109 is controlled by an actuation unit 109a that may comprise a piezo-electric actuator.

The intermediate chamber 103 may be constructed so that the opening 108 between the intermediate chamber and the main chamber is formed by the first aperture array element. This can be achieved by forming a portion of the wall 103a of the intermediate chamber to fit closely with the first aperture array element 6. For example, a recess may be formed in the intermediate chamber wall 103a to accommodate the outer edge of the first aperture array element, as can be seen in FIGS. 11 and 12. In this way, the size of the opening 108 is greatly reduced, the area of the opening comprising the plurality of very small apertures of the first aperture array. This greatly reduced size of the opening 108 permits a much larger differential pressure to be maintained between the intermediate chamber 102 and the main chamber 101.

The lithography system is preferably designed in a modular fashion to permit ease of maintenance. Major subsystems are preferably constructed in self-contained and removable modules, so that they can be removed from the lithography machine with as little disturbance to other subsystems as possible. This is particularly advantageous for a lithography machine enclosed in a vacuum chamber, where access to the machine is limited. Thus, a faulty subsystem can be removed and replaced quickly, without unnecessarily disconnecting or disturbing other systems. In the embodiment shown in FIGS. 10-12, these modular subsystems may include a beam switching module 121 including condenser lens arrays 74, multi-aperture array 75, beamlet blanker array 9, and a projection optics module 122 including beam stop array 10 and projection lens arrays 12. The modules are designed to slide in and out from an alignment frame. Each module requires a large number of electrical signals and/or optical signals, and electrical power for its operation. The modules inside the vacuum chamber receive these signals from control systems which are typically located outside of the chamber. The vacuum chamber includes openings or ports for admitting cables carrying the signals from the control systems into the vacuum housing while maintaining a vacuum seal around the cables. Each module preferably has its collection of electrical, optical, and/or power cabling connections routed through one or more ports dedicated to that module. This enables the cables for a particular module to be disconnected, removed, and replaced without disturbing cables for any of the other modules.

The main vacuum chamber 101 is provided with an outlet and vacuum pumping system 111. The source chamber 102 may be provided with its own outlet 112 and pump 113, and intermediate chamber 103 may also be provided with an outlet 114 and pump 115. The pumps 113 and 115 are shown schematically exhausting externally of the main chamber. This may result in vibrations being fed through to the lithography system. Given the level of the vacuum in chambers 102 and 103, a chemical or getter pump may be used for catching molecules in these chambers without exhausting outside the main chamber. A cryogenic pump may also be used for these chambers, but may be precluded due to the small size of the chambers.

Pumping down the pressure level in the system may be performed in the following way. First, the main chamber 101 and intermediate chamber 103 and source chamber 102 are pumped down to the level of the main chamber 101. This may be accomplished completely or primarily by the pumping system 111 of the main vacuum chamber 101. The pumping system 111 may have one of more dedicated vacuum pumps for the main chamber, or one or more vacuum pumps may be shared between several main vacuum chambers for several separate lithography systems. Each main chamber may have a small vacuum pump, and share a larger vacuum pump. The ability to use more than one pump to realize a vacuum in the main vacuum chamber creates a vacuum pump redundancy that may improve the reliability of vacuum operation. If a vacuum pump malfunctions, another vacuum pump can take over its function.

The vacuum in the main vacuum chamber can be generated by turbo vacuum pumps, and a cryopump system may also be used. A water vapor cryopump, for example in the form of one or more cryopump shields 117, may be included in the main vacuum chamber 101 to capture water vapor in the main chamber to assist in forming the vacuum in the main chamber. This reduces the size of the vacuum pumps needed to produce an adequate vacuum and reduces pump down time, and uses no moving parts so that it does not introduce vibrations typically caused by other types of low temperature (<4K) systems. Preferably, the vacuum pump(s) are activated first followed by activation of the cryopump system. Activation of the vacuum pump system prior to the cryopump system may lead to a more efficient vacuum pumping procedure, and to further enhance efficiency, the vacuum pump(s) may be isolated from the main vacuum chamber after a certain period, e.g. the time needed to obtain a pressure value below a certain predetermined threshold value. After isolation of the vacuum pump(s), the cryopump system may continue to operate to complete generation of the vacuum.

Then the intermediate chamber and source chamber are additionally pumped to a desired lower pressure, preferably by means of a chemical getter in a manner known by a skilled person. By using a regenerative, chemical and so-called passive pump like a getter, the pressure level within the intermediate chamber and source chamber can be brought to lower levels than the pressure level in the main chamber without the need of a vacuum turbo pump. The use of a getter avoids the interior or immediate outside vicinity of the vacuum chamber being submitted to acoustical and/or mechanical vibrations as would be the case if a vacuum turbo pump would be used for this a purpose.

The main chamber is initially pumped down by pumping away the air inside the chamber. The pump down continues by catching as many as possible of the molecules left in the chamber using the cryopump shield or similar methods. This results in "catching" molecules circulating in the main chamber and preventing these molecules from entering the intermediate chamber and the source chamber. By using the apertures of one of the aperture arrays to form the opening between the main chamber and the intermediate chamber, thereby reducing the size of the opening, the chance of the (relatively many more) molecules in the main chamber from entering in the intermediate chamber is also reduced. In the same way the opening between source and intermediate chamber limits the chance of the further reduced amount of molecules from entering the source chamber. The use of an aperture array to separate the main chamber and the intermediate chamber permits a higher pressure differential between the chambers and reduces contaminant molecules moving from the main chamber into the intermediate chamber, and onwards to the source chamber.

The main chamber is much larger than the intermediate and source chambers, and contains many components that be a source of outgassing hydrocarbons, water and other contaminant molecules. The most intensive source of outgassing of hydrocarbons is from the resist-coated wafer exposed by the lithography system. These hydrocarbons interact with the charged particles and form EBID (electron beam induced deposition) deposits. The dominant growth of contamination is typically on the apertures, the contamination grown by an EBID process. The current density on the electrodes is much lower than on the apertures.

The intermediate chamber assists by limiting aperture deterioration due to contaminants and EBID growth, especially at the edges of apertures. Although the contamination problem, i.e. EBID growth in the apertures causing reduced aperture diameter, is more severe at the beam stop (which is closer to the source of the hydrocarbon outgassing) than at the aperture arrays, the effect of hydrocarbon partial pressure and EBID growth is also noticeable on the aperture array located further form the wafer, and may necessitate cleaning of the apertures. By having the opening 108 between the intermediate chamber 103 and the main chamber 101 formed by the apertures of one of the aperture array elements, a large pressure differential can be maintained between the source and intermediate chambers and the main chamber. Furthermore, the hydrocarbon partial pressure in the intermediate chamber is reduced very significantly to a very low level, and in the source chamber to an even lower level, as indicated in FIG. 8B. This lower hydrocarbon partial pressure greatly reduces EBID growth on the aperture arrays and other components located in these chambers.

The idea of the present invention is to combine the two aspects into one design, such that each of the two aspects meets a minimum specification, i.e. a maximum pressure. These two aspects are maintaining the required pressure differential between the source chamber and the main chamber, and reducing incidence of contaminants in the intermediate and source chambers, in particular by reducing the hydrocarbon partial pressure in these chambers and reducing EDIB growth. With the use of the intermediate chamber, contamination of components in the intermediate and source chambers due to contaminants such as hydrocarbons is expected to drop by a factor of 100 according to preliminary calculations.

Figure 13:
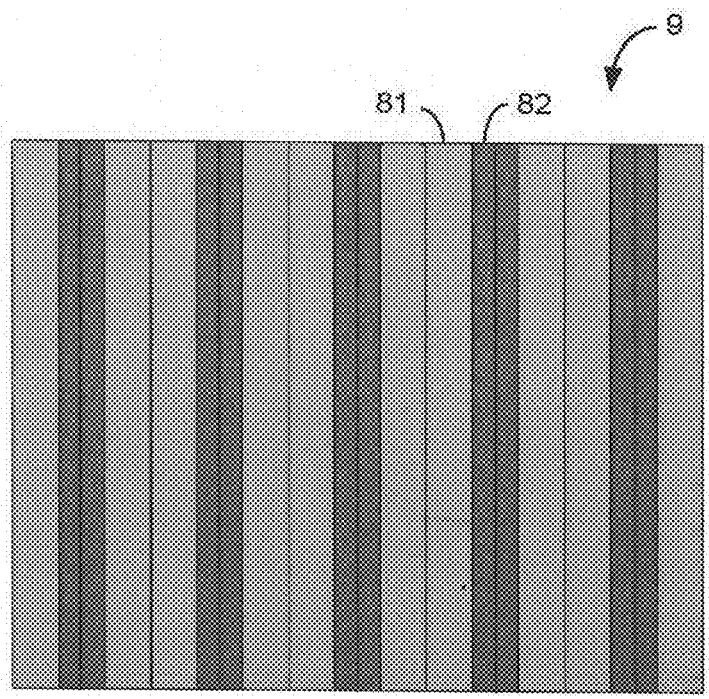
FIG. 13 is a top view of one embodiment of a beamlet blanker element showing beam areas and non-beam areas.

FIG. 13 is a top view of the beamlet blanker element 9 showing beam areas 81 (also referred to as aperture areas) and non-beam areas 82 (also referred to as non-aperture areas). Preferably the beam and non-beam areas are composed as rectangular shaft cross sections, composed of a non-beam area 82 of half the width of that of a beam area 81, typically of 4 mm and 2 mm width. Such sets are included in the system with the non-beam areas or shafts included back-to-back.

Figure 14:
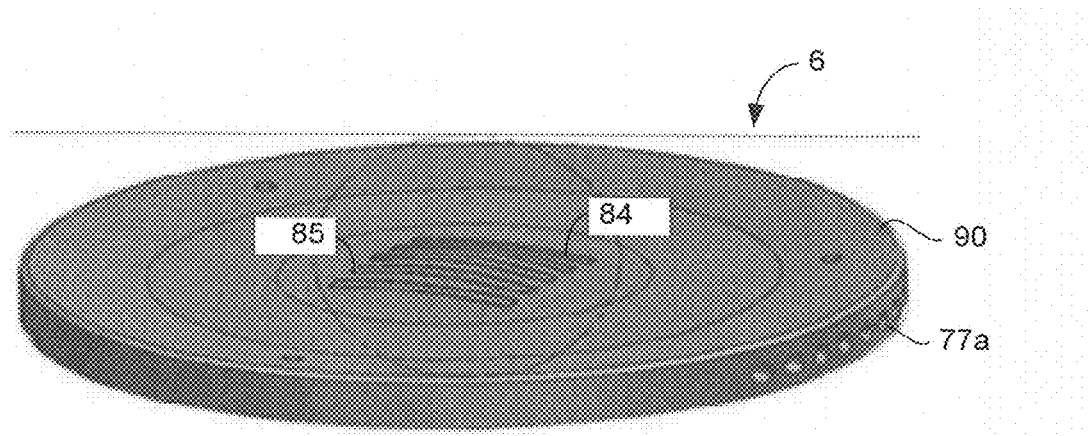
FIGS. 14 and 15 are diagrams of another embodiment of an aperture array element with beam and non-beam areas and cooling channels.
Figure 15:
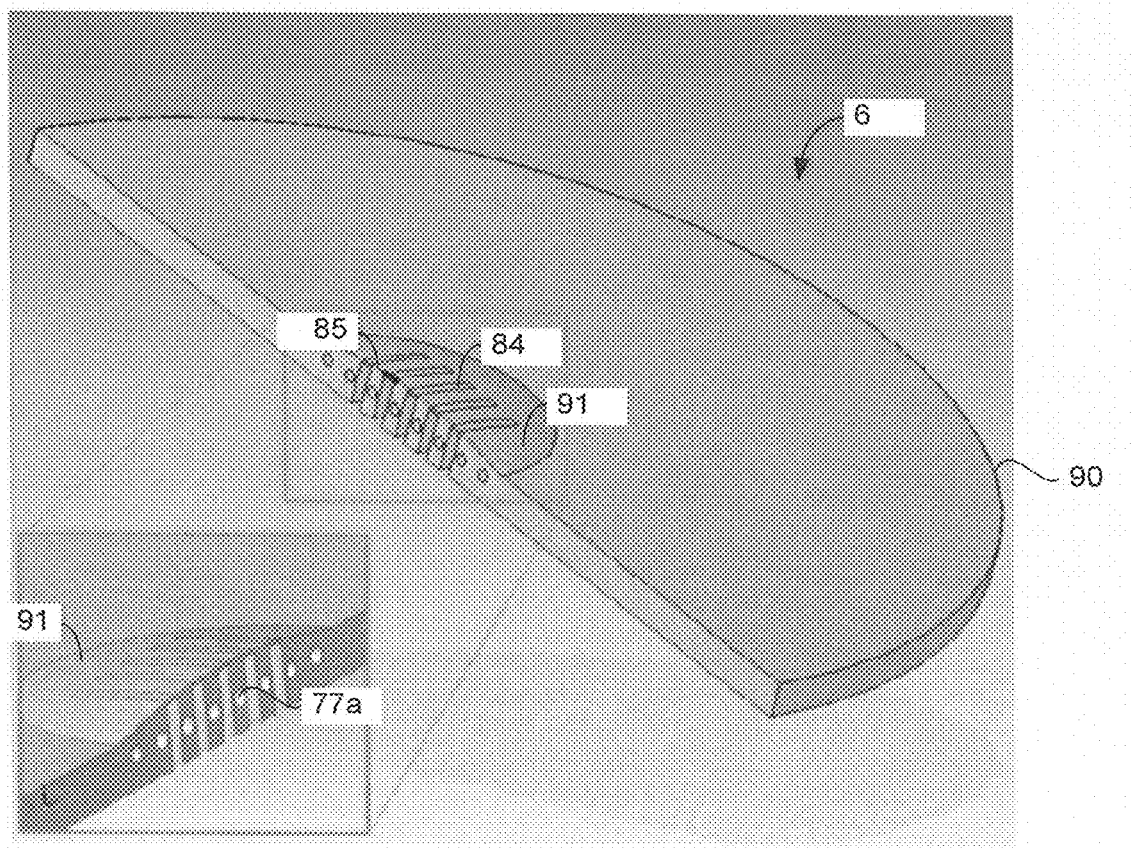

FIGS. 14 and 15 show an embodiment of the first aperture array element 6 comprising a monolithic plate 90 with a curved upper surface. This embodiment of the aperture array element 6 may be used in any of the embodiments of the lithography system described herein and with the other array elements described herein, may include a collimator aperture array 6a and current limiting aperture array 6b formed as an integral unit, and may include alternating beam and non-beam areas aligned with and forming shafts are described herein.

The upper surface of the aperture array is curved upwards (in the direction of the charged particle source) in a simple convex shape to form a raised dome-shaped portion 91. The center of the curve may be about 3 mm higher than the edge of the curved section, with a circumference of for example 50 mm. The aperture areas 84 represent areas arranged to receive the charged particle beam and each aperture area 84 comprises a plurality of apertures in the form of through holes. In this embodiment, the aperture areas 84 are rectangular in shape (5 rectangular aperture areas are shown but a different number may be used) to match the rectangular shaped beam areas of the other elements such as the blanker array 9 shown in FIG. 11. The non-aperture areas 85 are areas free of apertures and form rectangular areas between and alternating with the apertures areas 84. The plate 90 of the aperture array includes cooling channels 77a formed internally in the plate, through which a cooling medium may flow. The cooling channels extend through the non-aperture areas 85, extending along the length of each non-aperture area.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. A charged particle lithography system for transferring a pattern onto the surface of a target, comprising:
    a main vacuum chamber;
    a source chamber and an intermediate chamber, both located in the main vacuum chamber;
    a beam generator for generating a charged particle beam, the beam generator located in the source chamber;
    a first aperture array element for generating a plurality of charged particle beamlets from the beam, the first aperture array element separating the main chamber and the intermediate chamber to permit a higher pressure differential between the two chambers;
    wherein the system is adapted for maintaining a first pressure in the main vacuum chamber, a second pressure in the intermediate chamber, and a third pressure in the source chamber, and wherein the first pressure is lower than an ambient pressure, the second pressure is lower than the first pressure, and the third pressure is lower than the second pressure.

2. The system of claim 1, wherein the intermediate chamber includes a first opening for permitting transmission of the charged particle beam from the source chamber into the intermediate chamber, and a second opening for permitting transmission of the charged particle beamlets out of the intermediate chamber into the main vacuum chamber, wherein apertures of the first aperture array element form the second opening.

3. The system of claim 2, further comprising a valve for closing the second opening of the intermediate chamber.

4. The system of claim 1, wherein the source chamber comprises an outlet and pumping system for producing the third pressure in the source chamber.

5. The system of claim 1, wherein the source chamber and the intermediate chamber each comprise an outlet and pumping system for producing the second pressure in the intermediate chamber and the third pressure in the source chamber.

6. The system of claim 1, further comprising a collimating system located in the intermediate chamber adapted for collimating the charged particle beam prior before it reaches the first aperture array.

7. The system of claim 1, wherein the first aperture array element comprises a plurality of apertures arranged in a plurality of groups, the apertures for letting the beamlets pass through the aperture array element, wherein the groups of apertures form beam areas distinct and separate from a plurality of non-beam areas formed between the beam areas and containing no apertures for passage of the beamlets.

8. The system of claim 7, wherein the first aperture array element is provided with cooling channels adapted for transmission of a cooling medium for cooling the first aperture array element, the cooling channels being provided in the non-beam areas of the first aperture array element.

9. The system of claim 8, wherein the first aperture array element comprises a plate having a thickness and a width, wherein the apertures are formed through the thickness of the plate in the non-beam areas of the plate, and the cooling channels are formed internally in the non-beam areas of the plate and extend in a direction of the width of the plate.

10. The system of claim 1, wherein the first aperture array element comprises an integral current limiting aperture array, the apertures of the first aperture array element having a narrowest portion recessed below an upper surface of the first aperture array element facing towards the beam generator.

11. The system of claim 1, further comprising a plurality of aperture array elements including the first aperture array element, a blanker array, a beam stop array, and a projection lens array, each comprising a plurality of apertures arranged in a plurality of groups, the apertures for letting the beamlets pass through the aperture array elements, and wherein the groups of apertures of each aperture array element form beam areas distinct and separate from a plurality of non-beam areas formed between the beam areas and containing no apertures for passage of the beamlets, and wherein the beam areas of the aperture array elements are aligned to form beam shafts, each comprising a plurality of beamlets, and the non-beam areas of the aperture array elements are aligned to form non-beam shafts not having beamlets present therein.

12. The system of claim 1, wherein the first aperture array element is provided with a curved upper surface facing towards the beam generator.

13. The system of claim 12, wherein the first aperture array element is subdivided into alternating aperture-free areas and aperture areas, each aperture area comprising a plurality of apertures, and wherein the curved upper surface encompasses a plurality of the aperture-free areas and aperture areas.

14. The system of claim 12, wherein the curved upper surface of the first aperture array element forms a raised dome-shaped area protruding above the upper surface towards the beam generator.

15. The system of claim 12, wherein the curved upper surface of the first aperture array element forms a dome-shaped depression in the upper surface area facing the beam generator.

16. The system of claim 12, wherein the system has an optical axis and the curved surface is shaped according to a cosine function centered around the optical axis.

* * * * *